United States Patent
Kuo et al.

(10) Patent No.: US 10,714,371 B2
(45) Date of Patent: Jul. 14, 2020

(54) METHOD AND APPARATUS FOR LITHOGRAPHY IN SEMICONDUCTOR FABRICATION

(71) Applicant: Taiwan Semiconductor Manufacturing Co., Ltd., Hsinchu (TW)

(72) Inventors: Chueh-Chi Kuo, Kaohsiung (TW); Tsung-Yen Lee, Jhudong Township, Hsinchu County (TW); Chia-Hsin Chou, Hsinchu (TW); Tzung-Chi Fu, Miaoli (TW); Li-Jui Chen, Hsinchu (TW); Po-Chung Cheng, Zhongpu Township, Chiayi County (TW); Che-Chang Hsu, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/044,765

(22) Filed: Jul. 25, 2018

(65) Prior Publication Data

US 2019/0148203 A1 May 16, 2019

Related U.S. Application Data

(60) Provisional application No. 62/586,990, filed on Nov. 16, 2017.

(51) Int. Cl.
| | | |
|---|---|---|
| H01L 21/683 | (2006.01) | |
| G03F 1/24 | (2012.01) | |
| G03F 7/20 | (2006.01) | |

(52) U.S. Cl.
CPC ............ *H01L 21/6831* (2013.01); *G03F 1/24* (2013.01); *G03F 7/70033* (2013.01); *G03F 7/70708* (2013.01); *G03F 7/70716* (2013.01); *G03F 7/70841* (2013.01); *G03F 7/70916* (2013.01); *G03F 7/70933* (2013.01)

(58) Field of Classification Search
CPC .... G03F 1/24; G03F 7/70033; G03F 7/70708; G03F 7/70716; H01L 21/6831
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |

(Continued)

*Primary Examiner* — Deoram Persaud
(74) *Attorney, Agent, or Firm* — McClure, Qualey & Rodack, LLP

(57) ABSTRACT

A reticle holding tool is provided. The reticle holding tool includes a housing including a top housing member and a lateral housing member. The lateral housing member extends from the top housing member and terminates at a lower edge. The reticle holding tool further includes a reticle chuck. The reticle chuck is positioned in the housing and configured to secure a reticle. The reticle holding tool also includes a gas delivery assembly. The gas delivery assembly is positioned within the housing and configured to supply gas into the housing.

20 Claims, 7 Drawing Sheets

(56) References Cited

U.S. PATENT DOCUMENTS

| | | | |
|---|---|---|---|
| 9,529,268 B2 | 12/2016 | Chang et al. | |
| 9,548,303 B2 | 1/2017 | Lee et al. | |
| 10,274,844 B1* | 4/2019 | Chung | G03F 7/70733 |
| 2002/0089656 A1* | 7/2002 | Guo | G03B 27/62 |
| | | | 355/75 |
| 2005/0083499 A1* | 4/2005 | Van De Ven | G03F 7/707 |
| | | | 355/53 |
| 2005/0275835 A1* | 12/2005 | Sogard | B82Y 10/00 |
| | | | 356/237.2 |
| 2006/0007414 A1* | 1/2006 | Luttikhuis | G03F 7/70841 |
| | | | 355/30 |
| 2006/0017895 A1* | 1/2006 | Sogard | G03F 7/70875 |
| | | | 355/30 |
| 2006/0131682 A1* | 6/2006 | Moors | G03F 7/70908 |
| | | | 257/432 |
| 2008/0024751 A1* | 1/2008 | Hirayanagi | G03F 7/707 |
| | | | 355/75 |
| 2008/0184584 A1* | 8/2008 | Sogard | G03F 1/82 |
| | | | 34/275 |
| 2013/0003036 A1* | 1/2013 | Akiyama | G03F 1/62 |
| | | | 355/72 |
| 2015/0131071 A1* | 5/2015 | Kim | G03F 7/707 |
| | | | 355/72 |
| 2015/0323862 A1 | 11/2015 | Chang et al. | |
| 2015/0355557 A1* | 12/2015 | Cuypers | G03F 7/70358 |
| | | | 355/72 |
| 2017/0131638 A1* | 5/2017 | Kim | G03F 1/62 |

\* cited by examiner

METHOD AND APPARATUS FOR LITHOGRAPHY IN SEMICONDUCTOR FABRICATION

PRIORITY CLAIM AND CROSS-REFERENCE

This application claims the benefit of U.S. Provisional Application No. 62/586,990, filed on Nov. 16, 2017, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

A lithography exposure process forms a patterned photoresist layer for various patterning processes, such as etching or ion implantation. In a typical lithography process, a photosensitive layer (resist) is applied to a surface of a semiconductor substrate, and an image of features defining parts of the semiconductor device is provided on the layer by exposing the layer to a pattern of high-brightness light. As semiconductor processes evolve to provide for smaller critical dimensions, and devices become smaller and increase in complexity, including the number of layers, a way of accurately patterning the features is needed in order to improve the quality, reliability, and yield of the devices.

Although numerous improvements to the methods of performing a lithography exposure process have been invented, they have not been entirely satisfactory in all respects. Consequently, it would be desirable to provide a solution to improve the lithographic system so as to increase the production yield of the semiconductor wafers.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
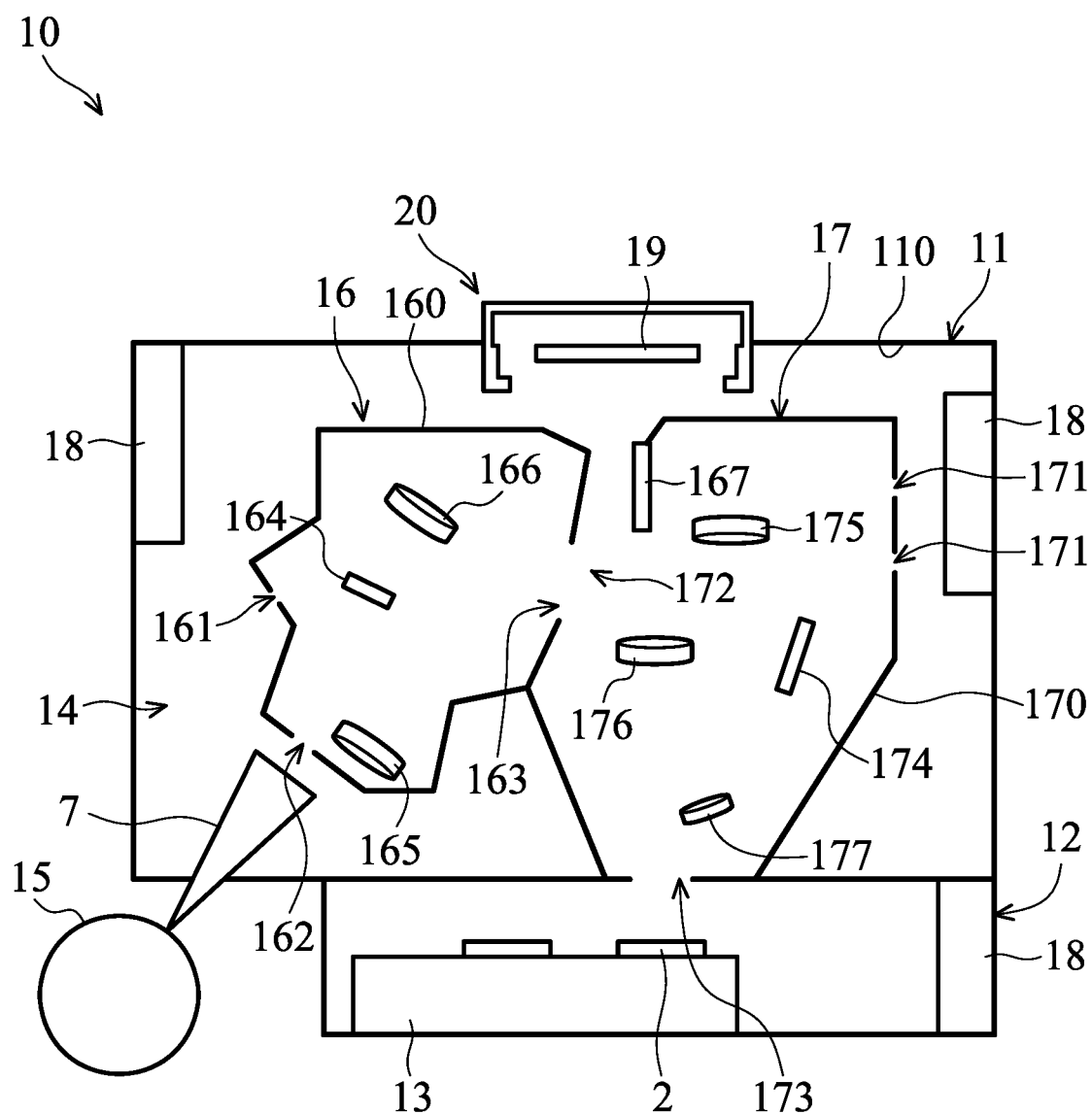
FIG. 1 is a schematic and diagrammatic view of a lithography system, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The advanced lithography process, method, and materials described in the current disclosure can be used in many applications, including fabrication of fin-type field effect transistors (FinFETs). For example, the advanced lithography process of the present disclosure is well suited to produce relatively closely-spaced features of FinFETs. In addition, spacers used in forming fins of FinFETs can be processed according to the current disclosure.

FIG. 1 is a schematic and diagrammatic view of a lithography system 10, in accordance with some embodiments. The lithography system 10 is configured to use a high-brightness light 7 to expose a photoresist layer coated on the semiconductor wafer 2. The lithography system 10 may be generically referred to as a scanner that is operable to perform lithography exposure process with respective high-brightness light source and exposure mode.

In some embodiments, the lithography system 10 includes a number of vacuum vessels, such as first vacuum vessel 11 and second vacuum vessel 12, a wafer stage 13, and an exposure tool 14. The elements of the lithography system 10 can be added to or omitted, and the invention should not be limited by the embodiment.

The first vacuum vessel 11 and the second vacuum vessel 12 preserve respective vacuum environments at ultra-high vacuum pressures. The vacuum pressure in the first vacuum vessel 11 may be lower than the second vacuum vessel 12. For example, the vacuum pressure in the first vacuum vessel 11 may be about $1.5*10^{-2}$ mB to about $2.8*10^{-2}$ mB, and the vacuum pressure in the second vacuum vessel 12 may be about $8*10^{-2}$ mB.

The wafer stage 13 is configured for supporting the semiconductor wafer 2 during the lithography exposing process. In some embodiments, the wafer stage 13 is positioned in the second vacuum vessel 12 and moveable between a leveling position and an exposure position in the second vacuum vessel 12 by a driving member, such as linear motor (not shown in figures). A radial and rotational movement of the wafer stage 13 can be coordinated or combined in order to transfer, and deliver the semiconductor wafer 2.

The exposure tool 14 is configured to apply a high-brightness light beam including a pattern in the beam's cross-section onto the surface of the semiconductor wafer 2 so as to print desired patterns over a photoresist layer coated on the semiconductor wafer 2. The exposure tool 14 is positioned over the wafer stage 13 when the wafer stage 13 is positioned in the exposure position.

In some embodiments, the exposure tool 14 includes a high-brightness light source 15, an illuminator 16, a projection optics module (or projection optics box (POB)) 17, a number of pumping members 18, a reticle 19, and a reticle holding tool 20. In some embodiments, all elements of the exposure tool 14 are positioned in the first vacuum vessel 11. In some other embodiments, partial elements of the exposure tool 14 are positioned in the first vacuum vessel 11. The technical features of the exposure tool 14, according to some embodiments, are described below.

The high-brightness light source 15 is configured to generate radiation having a wavelength ranging between about 1 nm and about 100 nm. In one particular example, the high-brightness light source 15 generates an extreme ultra-violet (EUV) light with a wavelength centered at about 13.5 nm. Accordingly, the high-brightness light source 15 is also referred to as EUV light source. However, it should be appreciated that the high-brightness light source 15 should not be limited to emitting EUV light. The high-brightness light source 15 can be utilized to perform any high-intensity photon emission from excited target material. For example, the high-brightness light source 15 may include a high-brightness light source, such as an ultraviolet (UV) source or a deep ultra-violet (DUV) source.

In some embodiments, the illuminator 16 includes a chamber 160. The chamber 160 is positioned in the first vacuum vessel 11 and has a number of orifices 161 for exhausting gas inside the chamber 160. In addition, the chamber 160 includes a light entry passage 162 and a light emitting passage 163 for allowing the light generated from the high-brightness light source 15 to enter and leave the chamber 160.

In some embodiments, the illuminator 16 further includes a gas inlet 164 located in the chamber 160. The gas inlet 164 is configured for discharging gas, such as $H_2$, $N_2$ or XCDA into the chamber 160. Due to the gas being supplied into the chamber 160 from the gas inlet 164, the vacuum pressure in the chamber 160 may be higher than the vacuum pressure in the first vacuum vessel 11 (i.e., the space outside of the chamber 160). In some embodiments, the vacuum pressure in the first vacuum vessel 11 may be about $1.5*10^{-2}$ mB to about $2.8*10^{-2}$ mB, and the vacuum pressure in the chamber 160 may be about $3.3*10^{-2}$ mB.

In some embodiments, the illuminator 16 also includes various refractive optical components 165, 166 and 167. The refractive optical components 165, 166 and 167 may be a lens system having multiple lenses (zone plates) or alternatively reflective optics (for EUV lithography system), such as a single mirror or a mirror system having multiple mirrors in order to direct light from the high-brightness light source 15 onto the reticle holding tool 20, particularly to a reticle 19 secured on the reticle holding tool 20. In the present embodiment where the high-brightness light source 15 generates light in the EUV wavelength range, reflective optics is employed.

The projection optics module (or projection optics box (POB)) 17 is configured for imaging the pattern of the reticle 19 on to the semiconductor wafer 2 secured on the wafer stage 13. In some embodiments, the POB 17 includes a chamber 170. The chamber 170 is positioned in the first vacuum vessel 11 and has a number of orifices 171 for exhausting gas inside the chamber 170. In addition, the chamber 170 includes a light entry passage 172 and a light emitting passage 173 for allowing the light generated from the high-brightness light source 15 to enter and leave the chamber 170.

In some embodiments, the POB 17 further includes a gas inlet 174 located in the chamber 170. The gas inlet 174 is configured for discharging gas, such as $H_2$, $N_2$ or XCDA into the chamber 170. Due to gas being supplied into the chamber 170 from the gas inlet 174, the vacuum pressure in the chamber 170 may be higher than the vacuum pressure in the first vacuum vessel 11 (i.e., the space outside of the chamber 170). In some embodiments, the vacuum pressure in the first vacuum vessel 11 may be about $1.5*10^{-2}$ mB to about $2.8*10^{-2}$ mB, and the vacuum pressure in the chamber 170 may be about $3.8*10^{-2}$ mB.

In some embodiments, the POB 17 also includes various refractive optical components 175, 176 and 177, such as refractive optics (such as for a UV lithography system) or alternatively reflective optics (such as for an EUV lithography system) in various embodiments. The light directed from the reticle 19, carrying the image of the pattern defined on the mask, is collected by the POB 17. The illuminator 16 and the POB 17 are collectively referred to as an optical module of the exposure tool 14.

In some embodiments, the exposure tool 14 further includes a number of actuators (not shown in the figures) connected to the illuminator 16 and the POB 17 to adjust the position of optic elements of the illuminator 16 and the POB 17. The actuators are electrically connected to the controlling apparatus (not shown in figures). In addition, the actuator is controlled to drive the movement of the optic elements of the illuminator 16 and the POB 17 according the signals issued by the controlling apparatus. As a result, the focal length of the high-brightness light scanned over the semiconductor wafer 2 can be adjusted.

The pumping members 18 are configured to create a vacuum in the first vacuum vessel 11 and the second vacuum vessel 12. The pumping members 18 may include a number of vacuum pumps with different ultimate pressure connected in series so as to improve the pumping speed of the first vacuum vessel 11 and the second vacuum vessel 12.

For example, the pumping member 18 includes a primary pump connected in series to a secondary pump. The primary pump is used to lower pressure from one pressure state (typically atmospheric pressure) to a lower pressure state, and after which the secondary pump is used to evacuate the process chamber down to high-vacuum levels needed for processing. The primary pump may be a skimmer pump, a diaphragm pump, a rotary vane pump, or a scroll pump. The secondary pump may be a high-vacuum molecular pump, or a rotary pump. The gas exhausted from the pumping member 18 may be discharged into a gas handling system (not shown) of a FAB via a gas conduit (not shown in figure).

Figure 2:
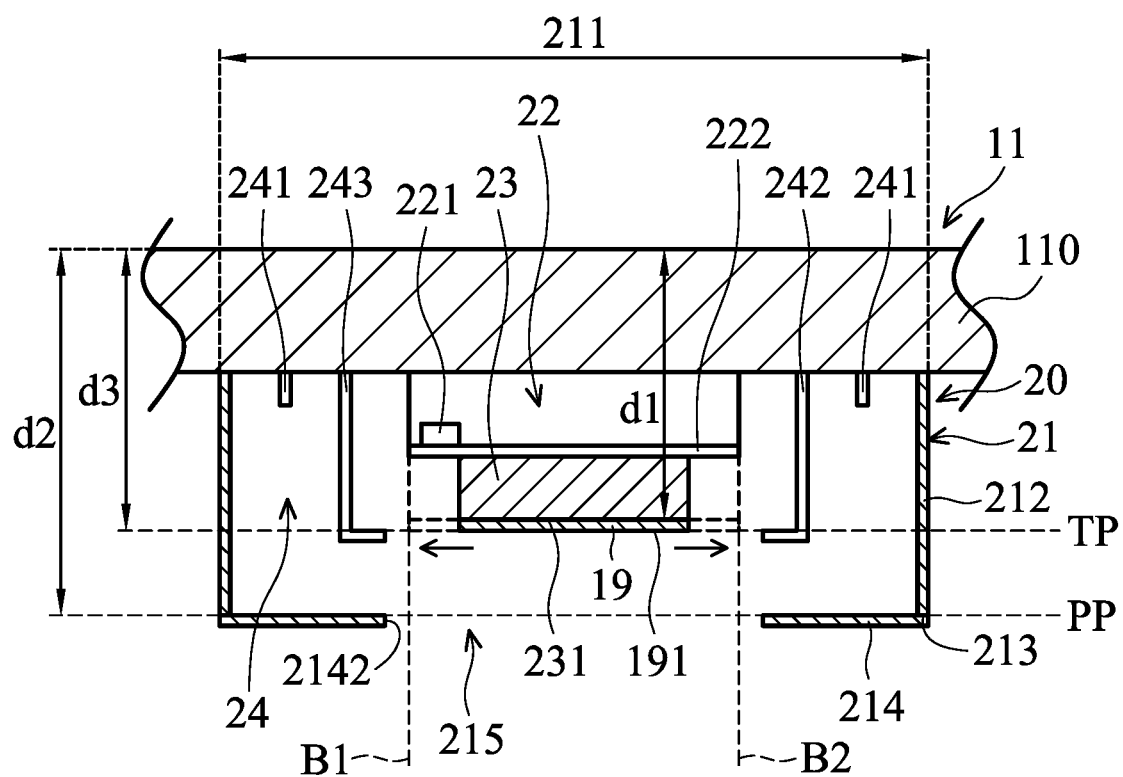
FIG. 2 is a cross-sectional view of a reticle holding tool, in accordance with some embodiments.

FIG. 2 shows a cross-sectional view of the reticle holding tool 20, in accordance with some embodiments. In some embodiments, the reticle holding tool 20 includes a lateral housing member 212, a lower housing member 214, a stage 22, a reticle chuck 23, and a gas delivery assembly 24. The elements of the reticle holding tool 20 can be added to or omitted, and the invention should not be limited by the embodiment.

The stage 22 is configured to support the reticle chuck 23 and control the movement of the reticle chuck 23. In some embodiments, the stage 22 is positioned on a top panel 110 of the first vacuum vessel 11. The top panel 110 and the light emitting passage 173 may be located at two opposite sides of the first vacuum vessel 11, as shown in FIG. 1. In some embodiments, the stage 22 includes one or more actuators and guiding members to drive a movement of the reticle chuck 23 in one or multiple directions. For example, as shown in FIG. 2, the stage 22 includes an actuator 221 and a guiding member 222 connected to the actuators 221. The actuator 221 may be a step motor and the guiding member 222 may include a linear guideway.

In some embodiments, the reticle chuck 23 is an electrostatic chuck (e-chuck) to secure the reticle 19 by an electrostatic force. In some embodiments, the reticle chuck 23 is connected to the guiding member 222. When the actuator 221 is operated, the guiding member 222 is driven to move to control a movement of the reticle chuck 23 forth and back in a direction that is parallel to a predetermined plane PP as indicated by FIG. 2.

In some embodiments, an area of the bottom surface 231 of the reticle chuck 23 which is covered by the reticle 19 during the lithography exposure process is referred to as an effective area. In some embodiments, partial area of the bottom surface 231 is covered by the reticle 19 during the lithography exposing process. In some other embodiments, the entire area of the bottom surface 231 is covered by the reticle 19 during the lithography exposing process.

In some embodiments, the lateral housing member 212 has a ring shape and extends away from the top panel 110 and terminates at a predetermined plane PP with a lower edge 213. The predetermined plane PP may be parallel to the horizontal direction and located away from the top panel 110. A distance d2 between the top panel 110 and the predetermined plane PP is greater than a distance d1 from the top panel 110 to the effective surface of the reticle chuck 23. That is, the effective surface is located between the predetermined plane PP and the top panel 110.

In some embodiments, the extending direction of the lateral housing member 212 is perpendicular to the top panel 110. In some other embodiments, the extending direction of the lateral housing member 212 is askew with the top panel 110. An included angle between the inner wall of the lateral housing member 212 and the top panel 110 is an obtuse angle. Namely, the width of the lateral housing member 212 gradually decreases in a direction away from the top panel 110.

The lower housing member 214 has a ring shape and is connected to the lower edge 213 of the lateral housing member 212. In some embodiments, the lower housing member 214 extends on the predetermined plane PP. In some other embodiments, the lower housing member 214 extends away from the lower edge 213 and terminates at its inner edge 2142 to form an opening 215. In some other non-illustrated embodiments, the lower housing member 214 is inclined relative to the predetermined plane PP, and a distance formed between the lower housing member 214 and the top panel 110 may gradually increases in a direction away from the lower edge 213 to the inner edge 2142. In some embodiments, the lower housing member 214 is omitted. The lower housing member 214 may be replaced by a blade of reticle mask (REMA) which defines an area of an exposure field.

In some embodiments, the inner edge 2142 of the lower housing member 214 defines an opening 215. The opening 215 may have a rectangular shape, a circular shape, an elliptical shape, a polygonal shape, an irregular shape, or combinations thereof. In some embodiments, the width of the opening 215 is sufficiently large to allow the entry or exit of the high-brightness light from the high-brightness light source 15 and to allow the reticle 19 to be replaced.

In some embodiments, during the lithography exposure process, the reticle chuck 23 is movable between two boundary lines B1 and B2. The width of the opening 215 is greater than the distance between the two boundary lines B1 and B2. That is, in a direction that is perpendicular to the effective surface of the reticle chuck 23 (or the top panel 110 of the first vacuum vessel 11), the projection of the lower housing member 214 is located outside of the effective surface of the reticle chuck 23.

Figure 3:
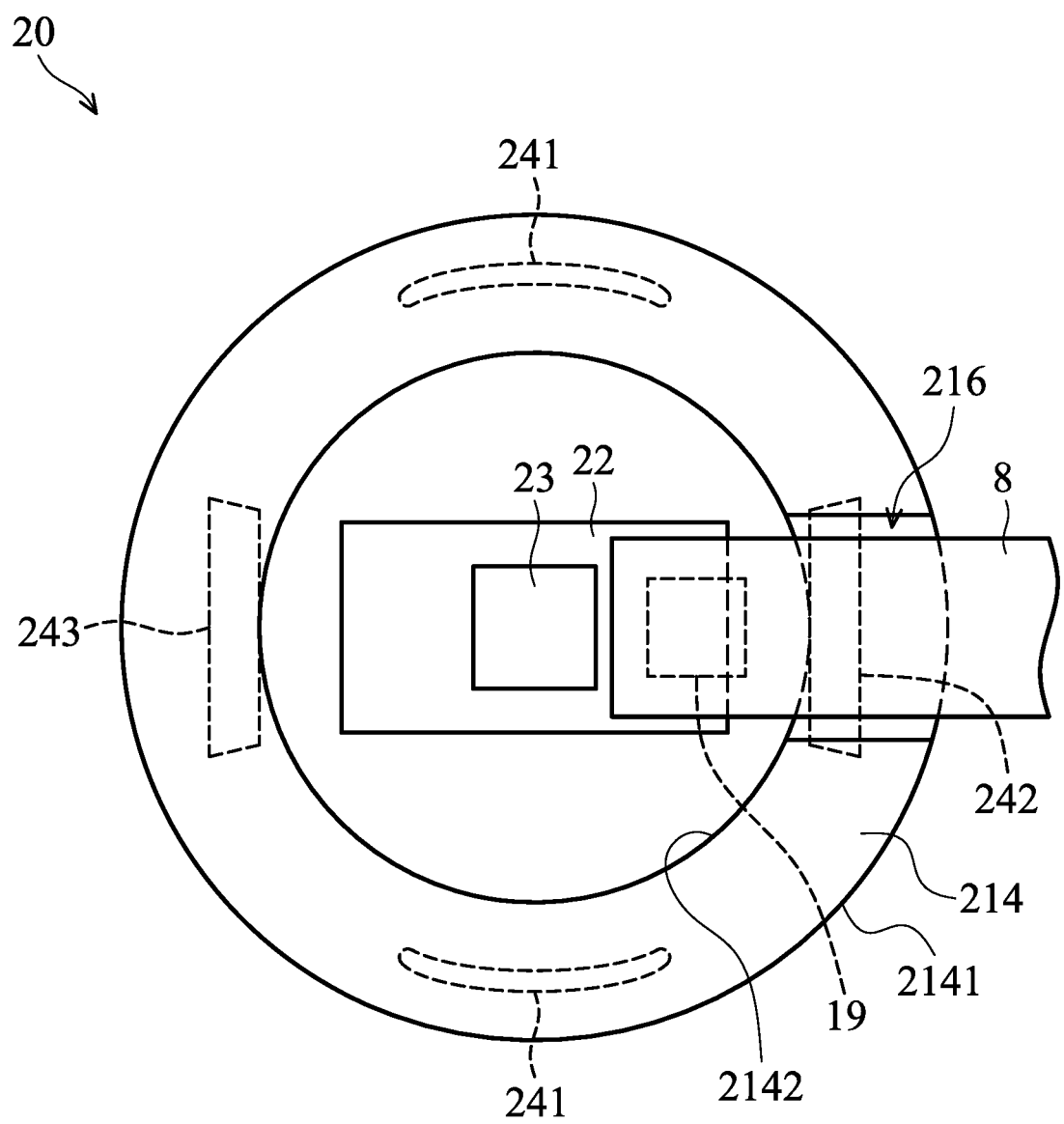
FIG. 3 is a bottom view of the reticle holding member and a reticle handling robot, in accordance with some embodiments.

FIG. 3 shows a bottom view of the reticle holding tool 20 and a reticle handling robot 8, in accordance with some embodiments. In some embodiments, there is a recess 216 formed on the bottom surface of the lower housing member 214. The recess 216 extends from the outer edge 2141 to the inner edge 2142. The recess 216 has a shape that is compatible with the shape of the reticle handling robot 8 which is used to move the reticle 19 to and from the reticle chuck 23.

The recess 216 allows an upward movement of the reticle handling robot 8 relative to the reticle chuck 23. In some embodiments, to load the reticle 19 on the reticle chuck 23, the reticle chuck 23 is lowered down by the stage 22 to approach the opening 215. In addition, the reticle handling robot 8 is moved below the opening 215, and then is move upward to put the reticle 19 on the reticle chuck 23. After the upward movement of the reticle handling robot 8, a portion of the reticle handling robot 8 is received in the recess 216. In some other embodiments, the recess 216 is omitted, the distance d2 (FIG. 2) of the lateral housing member 212 is configured so that the reticle 19 puts on the reticle chuck 23 by the reticle handling robot 8 while the reticle 19 is lowered by the stage 22.

Referring back to FIG. 2, in some embodiments, a portion of the top panel 110 which is surrounded by the lateral housing member 212 is referred to as a top housing member 211. In addition, the top housing member 211, the lateral housing member 212 and the lower housing member 214 are collectively referred to as a housing 21. The interior of the housing 21 is shielded from the exterior of the housing 21 (i.e., the interior of the first vacuum vessel 11) by the top housing member 211, the lateral housing member 212 and the lower housing member 214. The opening 215 allows a gas to flow between the interior of the housing 21 and the exterior of the housing 21.

The gas delivery assembly 24 is configured for supplying one or more gases into the housing 21. In some embodiments, the gas delivery assembly 24 includes a number of gas inlets, such as two first gas inlets 241 and a second gas inlet 242, and a gas outlet 243.

Figure 5:
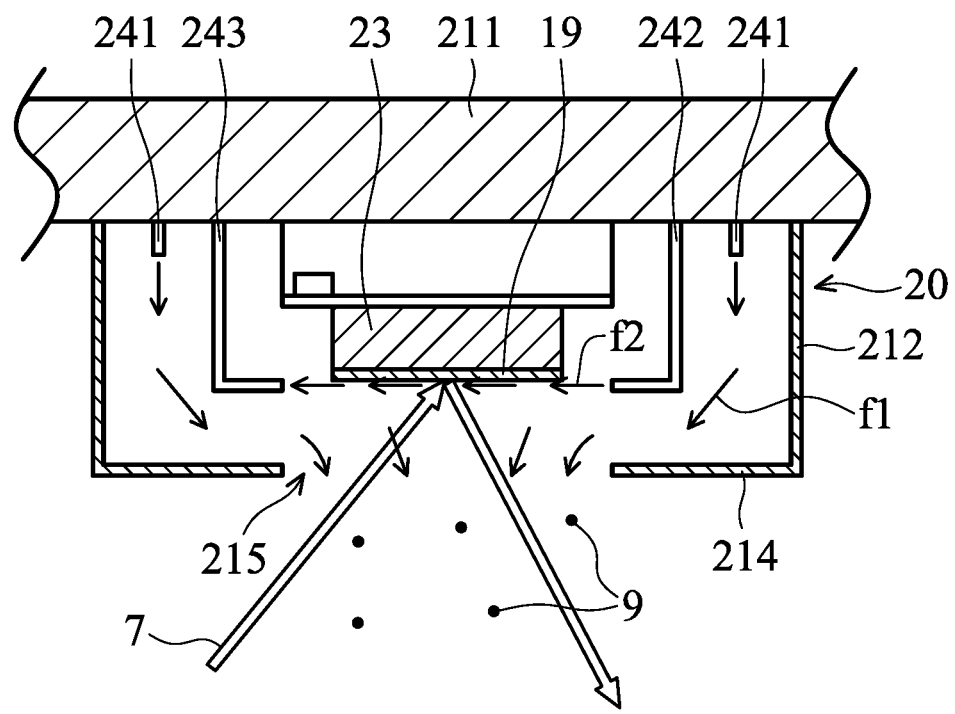
FIG. 5 is a cross-sectional view of one stage of a method for a lithography exposing process, in accordance with some embodiments.

In some embodiments, the two first gas inlets 241 are positioned in the interior of the housing 21. The two first gas inlets 241 are configured so that the gas from the first gas inlets 241 flowing toward the opening 215 located on the predetermined plane PP as indicated by FIG. 5.

For example, as shown in FIG. 2, the two first gas inlets 241 are positioned at two opposite sides of the stage 22 and connected to the top housing member 211. The two first gas inlets 241 face the predetermined plane PP, so that the gas from the two first gas inlets 241 flows to the predetermined plane PP and leaves the interior of the housing 21 via the opening 215. The first gas inlets 241 may be connected to a gas source (not shown in figures) via conduits (not shown in figures) formed in the first vacuum vessel 11. The gas supplied from the gas source may include $H_2$, $N_2$ or XCDA. The two first gas inlets 241 may include a nozzle which fixed on the top housing member 211. Alternatively, the two first gas inlets 241 may be slits which penetrate the top housing member 211.

However, it should be appreciated that many variations and modifications can be made to embodiments of the disclosure. In some other embodiments, the two first gas inlets 241 are connected to the lateral housing member 212 and positioned toward the stage 22 or the lower housing member 214. The two first gas inlets 241 may be connected to the gas source via a conduit formed in the lateral housing member 212. In some other embodiments, there is only one first gas inlet 241 positioned in the housing 21. The first gas inlet 241 may partially or entirely surround the stage 22. It should be appreciated that the number of the first gas inlets 241 should not be limited to the embodiment shown in FIG. 2 and can be varied according to demands. In some other embodiments, the first gas inlets 241 are omitted.

In some embodiments, the second gas inlet 242 is positioned in the interior of the housing 21. The second gas inlet 242 is configured so that gas from the second gas inlet 242 can flow in a direction that is substantially parallel to the effective surface of the reticle chuck 23 as indicated by arrows shown in FIG. 5.

For example, as shown in FIG. 2, the second gas inlet 242 is positioned adjacent to the stage 22 and connected to the top housing member 211. The second gas inlet 242 faces toward the reticle chuck 23, such that the gas from the second gas inlet 242 flows to the reticle chuck 23 and passes through the bottom surface 231 of the reticle chuck 23.

The second gas inlet 242 may be connected to a gas source (not shown in figures) via conduits (not shown in figures) formed in the top housing member 211. The gas supplied from the gas source may include $H_2$, $N_2$ or XCDA. The second gas inlet 242 may include a nozzle which is fixed on the top housing member 211.

In some embodiments, the gas outlet 243 is positioned in the interior of the housing 21. The second gas inlet 242 and the gas outlet 243 are configured such that the gas from the second gas inlet 242 passes through the bottom surface 231 of the reticle chuck 23 and is evacuated via the gas outlet 243 as indicated arrows shown in FIG. 5.

For example, as shown in FIG. 2, the second gas inlet 242 and the gas outlet 243 are positioned at two sides of the reticle chuck 23 and connected to the top housing member 211 or the reticle chuck 23. The height d3 of the second gas inlet 242 and the gas outlet 243 extending from the top housing member 211 may be the same. In addition, the opening of the second gas inlet 242 and the gas outlet 243 may face each other directly. Namely, the opening of the second gas inlet 242 and the gas outlet 243 are both located at a target plane TP which is parallel to the top housing member 211 and/or the predetermined plane PP. As a result, the gas from the second gas inlet 242 is sucked away by the gas outlet 243 after passing through the reticle chuck 23. The gas outlet 243 may be connected to a vacuum source via a conduit formed in the top housing member 211. In some embodiments, the gas outlet 243 is omitted. The gas from the second gas inlet 242 is supplied into the housing and leaves the interior of the housing via the opening 215.

Figure 4:
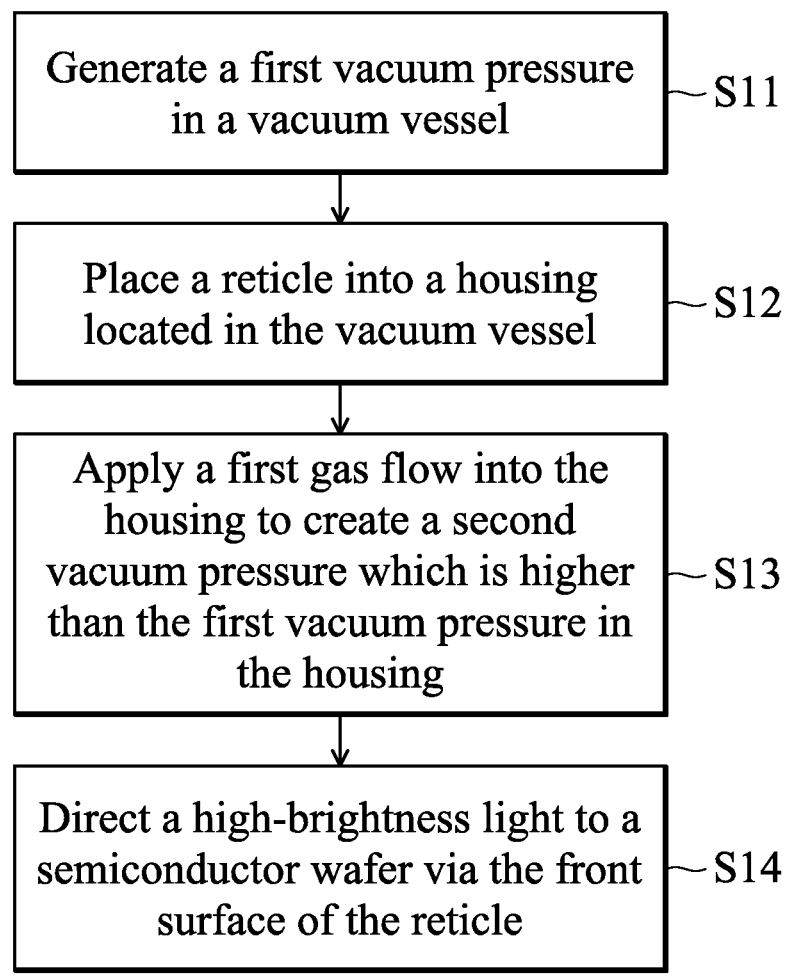
FIG. 4 is a flow chart illustrating a method for performing a lithographic process on the semiconductor wafer, in accordance with some embodiments.

FIG. 4 is a flow chart illustrating a method S10 for performing a lithography exposure process on the semiconductor wafer 2, in accordance with some embodiments. For illustration, the flow chart of FIG. 4 will be described along with the schematic views shown in FIGS. 3 and 5-6. Some of the stages described can be replaced or eliminated for different embodiments.

The method S10 includes operation S11, in which a first vacuum pressure is generated in a vacuum vessel, such as the first vacuum vessel 11 and second vacuum vessel 12. In some embodiments, the pumping members 18 are used to evacuate the first vacuum vessel 11 and the second vacuum vessel 12 down to high-vacuum levels needed for processing. In some embodiments, the vacuum pressure in the first vacuum vessel 11 may be about $1.5*10^{-2}$ mB to about $2.8*10^{-2}$ mB, and the vacuum pressure in the second vacuum vessel 12 may be about $8*10^{-2}$ mB.

The method S10 also includes operation S12, in which the reticle 19 is placed into the housing 21 located in the vacuum vessel. In some embodiments, the reticle 19 is transferred by a robotic arm 8 (FIG. 3) to a position below the reticle chuck 23. Before the reticle 19 aligns with the reticle chuck 23, the reticle chuck 23 may be lowered down in advance. Afterwards, the robotic arm 8 is lifted and inserted into the recess 216 to create a contact between the reticle 19 and the reticle chuck 23. Once the reticle 19 is in contact with the reticle chuck 23, the reticle 19 may be affixed to the reticle chuck 23 by an electrostatic force generated by the reticle chuck 23.

In the present embodiment, the reticle 19 is a reflective mask. One exemplary structure of the reticle 19 includes a substrate made of a suitable material, such as a low thermal expansion material (LTEM) or fused quartz. In various examples, the LTEM includes $TiO_2$ doped $SiO_2$, or another suitable material with low thermal expansion. The reticle 19 includes reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light.

The reticle 19 may further include a capping layer, such as ruthenium (Ru), disposed on the ML for protection. The reticle 19 may also include an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The method S10 also includes operation S13, in which gas is supplied into the housing 21 and the first vacuum vessels 11 via one or more gas inlets. In some embodiments, as shown in FIG. 5, a flow of the gas f1 is supplied into the housing 21 via the first inlets 241. After the flow of the gas f1 has left the first gas inlets 241, a portion of the flow of the gas f1 leaves the housing 21 via the opening 215 directly. In addition, a portion of the flow of the gas f1 is blocked by the top housing member 211, the lateral housing member 212 and the lower housing member 214 and stays in the interior of the housing 21 for a while. As a result, a second vacuum pressure that is higher than the first vacuum pressure is established in the interior of the housing 21.

In some embodiments, as shown in FIG. 5, the difference between the first vacuum pressure and the second vacuum pressure leads the first flow of gas f1 to stably flow outside of the housing 21 via the opening 215 so that particles 9 located outside of the housing 21 are blocked from entering the housing 21. Therefore, contamination of the reticle 19 and the reticle chuck 23 can be mitigated or avoided.

In some embodiments, as shown in FIG. 5, a second flow of gas f2 is supplied into the housing 21 via the second gas inlet 242, and at least a portion of the second flow of gas f2 is evacuated via the gas outlet 243. As a result, the second flow of gas f2 flows through the reticle chuck 23 and reticle 19. The second flow of gas f2 serves as an air curtain between the reticle 19 and the opening 215 and prevents the particle 9 from attaching the reticle 19. Moreover, the reticle 19 and the reticle chuck 23 are cooled by the second flow of gas f2 and kept at an acceptable temperature. Therefore, deformation of the reticle 19 due to high temperatures can be prevented.

Figure 6:
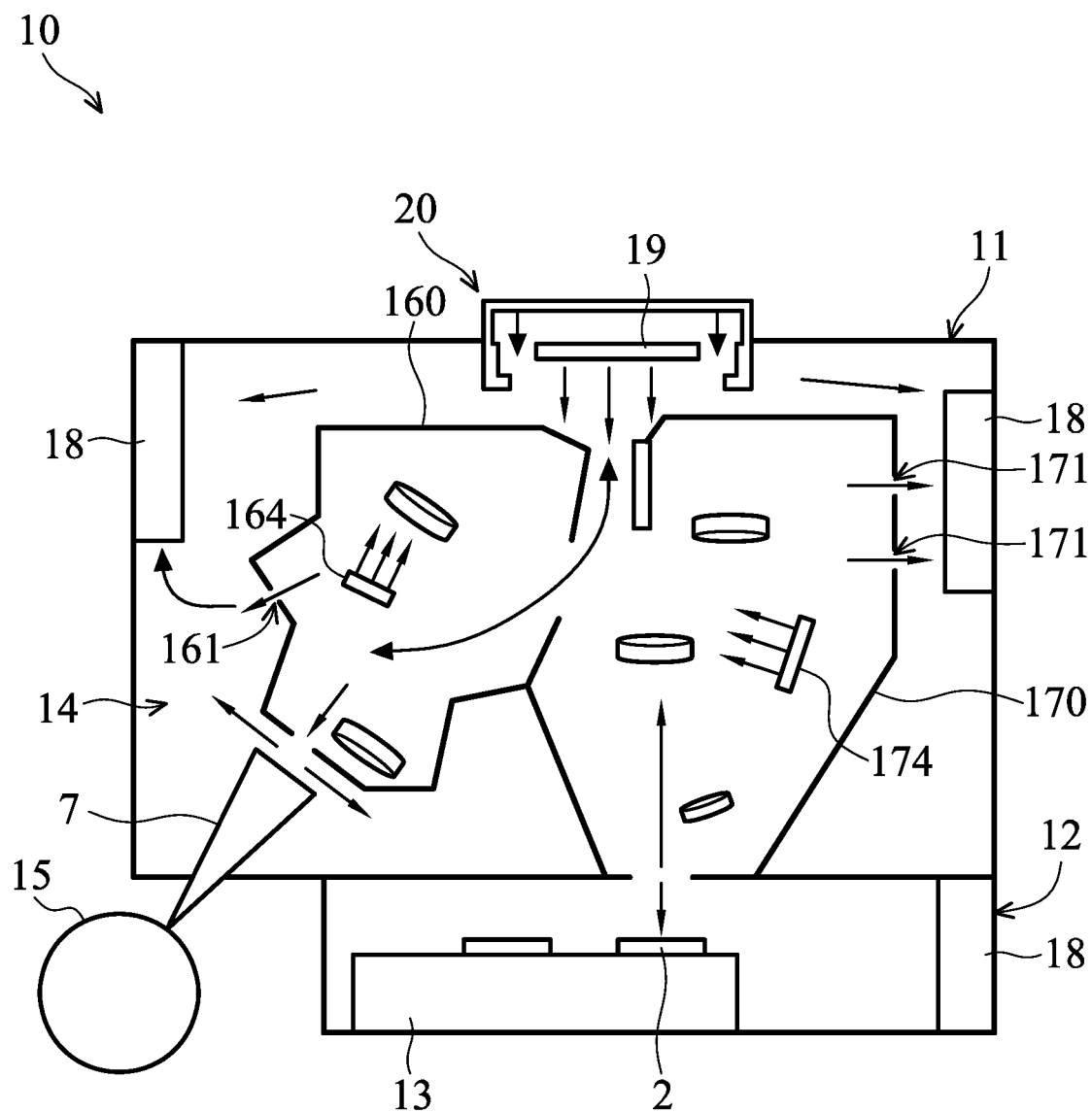
FIG. 6 is a schematic view of one stage of a method for a lithography exposing process, in accordance with some embodiments.

In some embodiments, in addition to the gas supplied from the gas inlets 241 and 242, the gas inlets 164 and 174 located in the chambers 160 and 170 are used to supply gas into the chambers 160 and 170 as shown in FIG. 6. Additionally, with the operation of the pumping members 18, the gas supplied from the gas inlets 241, 242, 164 and 174 are evacuated as along directions indicated by the arrows shown in FIG. 6.

The method S10 also includes operation S14, in which a lithography exposure process is performed on the semiconductor wafer 2 in the lithography system 10. In operation S14, the high-brightness light 7 generated by the high-brightness light source 15 is illuminated on the reticle 19 (by the illuminator 16), and is further projected on the resist layer coated on the semiconductor wafer 2 (by the POB 17), thereby forming a latent image on the resist layer. In some embodiments, the lithography exposure process is implemented in a scan mode.

The method S10 may further include other operations, such as an operation to perform a fabrication process on the semiconductor wafer 2 through the openings of the resist pattern. In one example, the fabrication process includes an etch process performed on the semiconductor wafer 2 using the resist pattern as an etch mask. In another example, the fabrication process includes an ion implantation process performed on the semiconductor wafer 2 using the resist pattern as an implantation mask.

Figure 7:
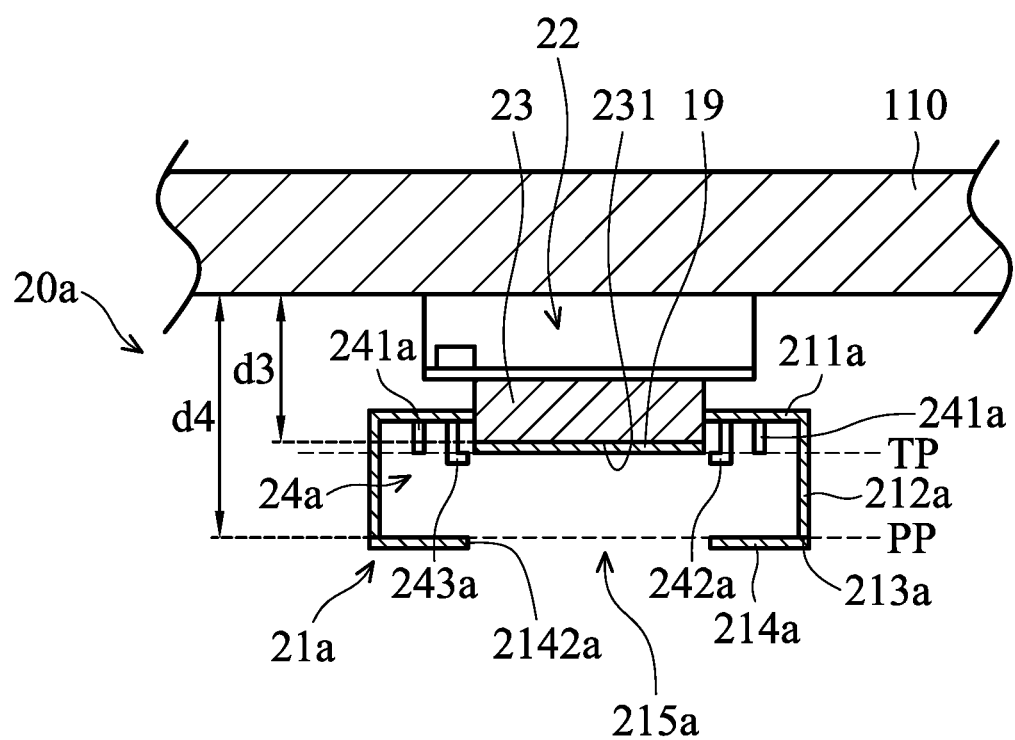
FIG. 7 is a cross-sectional view of a reticle holding tool, in accordance with some embodiments.

FIG. 7 shows a cross-sectional view of the reticle holding tool 20a, in accordance with some embodiments. In the embodiments shown in FIG. 7, elements that are similar to those shown in FIGS. 1-3 are provided with the same reference numbers, and the features thereof are not reiterated in the interests of brevity. Differences between the reticle holding tool 20a and the reticle holding tool 20 include the housing 21 being replaced by the housing 21a and the gas delivery assembly 24 being replaced by the gas delivery assembly 24a.

The housing 21a includes a top housing member 211a, a lateral housing member 212a and a lower housing member 214a. The top housing member 211a is connected to the reticle chuck 23. In some embodiments, the top housing member 211a has a ring shape and surrounds the reticle chuck 23. The lateral housing member 212a is connected to the outer edge of the top housing member 211a and extends from the top housing member 211a to the predetermined plane PP. A distance d4 between the top panel 110 and the predetermined plane PP is greater than a distance d3 from the top panel 110 to the effective surface of the retinal chuck 23. That is, the effective surface is located between the predetermined plane PP and the top panel 110.

The lower housing member 214a has a ring shape and is connected to the lower edge 213a of the lateral housing member 212a. In some embodiments, the lower housing member 214a extends on the predetermined plane PP. In some other embodiments, the lower housing member 214a extends away from the lower edge 213a and terminates at its inner edge 2142a to form an opening 215a. In some other non-illustrated embodiments, the lower housing member 214a is inclined relative to the predetermined plane PP, and a distance formed between the lower housing member 214a and the top panel 110 may gradually increases in a direction away from the lower edge 213 to the inner edge 2142. The distance between the lower housing member 214a and the top panel 110 gradually increases. In some embodiments, the lower housing member 214a is omitted.

In some embodiments, the inner edge 2142a of the lower housing member 214a defines an opening 215a. The opening 215a may have a rectangular shape, a circular shape, an elliptical shape, a polygonal shape, an irregular shape, or a combination thereof. In some embodiments, the width of the opening 215a is sufficiently large to allow the entry or exit of the high-brightness light from the high-brightness light source and to allow the reticle to be replaced. In some embodiments, in a direction that is perpendicular to the effective surface of the reticle chuck 23 (or the top panel 110 of the first vacuum vessel 11), the projection of the lower housing member 214a is located outside of the effective surface of the reticle chuck 23.

The gas delivery assembly 24a is configured for supplying one or more gases into the housing 21a. In some embodiments, the gas delivery assembly 24a includes a number of gas inlets, such as two first gas inlets 241a and a second gas inlet 242a, and a gas outlet 243a.

In some embodiments, the two first gas inlets 241a are positioned in the interior of the housing 21a. The two first gas inlets 241a are configured such that the gas from the first gas inlets 241a flowing toward the opening 215a located on the predetermined plane PP.

For example, the two first gas inlets 241a are positioned at two opposite sides of the reticle chuck 23 and connected to the top housing member 211a. The two first gas inlets 241a face the predetermined plane PP, such that the gas from the two first gas inlets 241a flow to the predetermined plane PP and leaves the interior of the housing 21a via the opening 215a. The first gas inlets 241a may be connected to a gas source (not shown in figures) via conduits (not shown in figures) formed in the top housing member 211a. The gas supplied from the gas source may include $H_2$, $N_2$ or XCDA. The two first gas inlets 241a may include a nozzle which fixed on the top housing member 211a. Alternatively, the two first gas inlets 241a may be slits which penetrate the top housing member 211a.

In some embodiments, the second gas outlet 242a is positioned in the interior of the housing 21a. The second gas inlet 242a is configured such that a gas from the second gas inlet flows in a direction that is substantially parallel to the effective surface of the reticle chuck 23.

For example, the second gas inlet 242a is positioned adjacent to the reticle chuck 23 and connected to the top housing member 211a. The second gas inlet 242a faces toward the reticle chuck 23, such that the gas from the second gas inlet 242a flows to the reticle chuck 23 and passes through the bottom surface 231 of the reticle chuck 23.

The second gas inlet 242a may be connected to a gas source (not shown in figures) via conduits (not shown in figures) formed in the top housing member 211a. The gas supplied from the gas source may include $H_2$, $N_2$ or XCDA. The second gas inlet 242a may include a nozzle which is fixed on the top housing member 211a.

In some embodiments, the gas outlet 243a is positioned in the interior of the housing 21a. The second gas inlet 242a and the gas outlet 243a are configured such that the gas from the second gas inlet 242a passes through the reticle chuck 23 and is evacuated via the gas outlet 243a.

For example, as shown in FIG. 7, the second gas inlet 242a and the gas outlet 243a are positioned at two sides of the reticle chuck 23 and connected to the top housing member 211a or the reticle chuck 23. The height of the second gas inlet 242a and the gas outlet 243a extending from the top housing member 211a may be the same. In addition, the opening of the second gas inlet 242a and the gas outlet 243a may face each other directly. Namely, the opening of the second gas inlet 242a and the gas outlet 243a are both located at a target plane TP which is parallel to the top housing member 211a and/or the predetermined plane PP. As a result, the gas from the second gas inlet 242a is sucked away by the gas outlet 243a after passing through the reticle chuck 23. The gas outlet 243a may be connected to a vacuum source via a conduit formed in the top housing member 211a or the reticle chuck 23. In some embodiments, the gas outlet 243a is omitted.

The method of using the reticle holding tool 20a to perform a lithography exposure process may be similar to the method S10 described above. However, while the reticle chuck 23 is moved by the stage 22 during the lithography exposing process, the housing 21a is moved along with the reticle chuck 23. Since the interior of the housing 21a has smaller volume, the second vacuum pressure can be created sooner in operation S13 of method S10.

Embodiments of a method and system for performing a lithography exposure process generating a flow of gas around the reticle chuck which is used to secure a reticle. The flow of gas prevents the reticle from being contaminated. As a result, the processing quality and the production yield are improved. In addition, since the life span of the reticle is prolonged, the manufacturing cost is reduced.

In accordance with some embodiments, a reticle holding tool is provided. The reticle holding tool includes a housing including a top housing member and a lateral housing member. The lateral housing member extends from the top housing member and terminates at a lower edge which is located on a predetermined plane. The reticle holding tool further includes a reticle chuck. The reticle chuck is positioned in the housing and has an effective surface configured to secure a reticle. The effective surface is located between the predetermined plane and the top housing member. The reticle holding tool also includes a gas delivery assembly. The gas delivery assembly is positioned within the housing and configured to supply gas into the housing.

In accordance with some embodiments, a lithographic system is provided. The lithographic system includes a vacuum vessel having a first vacuum pressure. The lithographic system further includes a housing positioned in the vacuum vessel and having a second vacuum pressure that is higher than the first vacuum pressure. The housing has an opening allowing an interior of the housing to communicate to the vacuum vessel. The lithographic system also includes a reticle chuck positioned in the housing. The reticle chuck has an effective surface for holding a reticle. The effective surface faces the opening. In addition, the lithographic system includes an exposure tool configured to generate high-brightness light toward the reticle. The lithographic system further includes a wafer stage configured to support a semiconductor wafer so as to allow the semiconductor wafer to receive the high-brightness light from the reticle.

In accordance with some embodiments, a method for performing a lithography exposing process is provided. The method includes generating a first vacuum pressure in a vacuum vessel. The method further includes placing a reticle into a housing located in the vacuum vessel. The housing communicates with the vacuum vessel via an opening, and a front surface of the reticle faces the opening. The method also includes applying a first flow of gas into the housing to create a second vacuum pressure which is higher than the first vacuum pressure in the housing. In addition, the method includes directing a high-brightness light to a semiconductor wafer via the front surface of the reticle.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A reticle holding tool, comprising:
   a housing comprising a top housing member, a lateral housing member, and a lower housing member, wherein the lateral housing member is connected to the top housing member, extending from the top housing member and terminating at a lower edge which is located on a predetermined plane, and the lower housing member is connected to the lower edge and extending inwardly;
   a reticle chuck positioned in the housing and having an effective surface configured to secure a reticle, wherein the effective surface is located between the predetermined plane and the top housing member, and wherein a projection of the lower housing member in a direction that is perpendicular to the effective surface is located outside of the effective surface; and
   a gas delivery assembly positioned within the housing and configured to supply gas into the housing.

2. The reticle holding tool as claimed in claim 1, wherein a recess is formed on the lower housing member;
   wherein the recess extends from an outer edge to an inner edge of the lower housing member.

3. The reticle holding tool as claimed in claim 1, further comprising:

a stage connected to the reticle chuck and configured to move the reticle chuck in a direction that is parallel to the predetermined plane;

wherein the top housing member is connected to the reticle chuck, and the reticle chuck together with the housing are movable relative to the stage.

4. The reticle holding tool as claimed in claim 3, wherein the housing has an opening, the reticle chuck is movable between two boundary lines, and a width of the opening is greater than a distance between the two boundary lines.

5. The reticle holding tool as claimed in claim 1, wherein the gas delivery assembly comprises a gas inlet configured to introduce a gas toward the predetermined plane.

6. The reticle holding tool as claimed in claim 1, wherein the gas delivery assembly comprises a gas inlet configured to introduce a gas along a direction substantially parallel to the effective surface of the reticle chuck.

7. The reticle holding tool as claimed in claim 6, wherein the gas delivery assembly further comprises a gas outlet, and the gas inlet and the gas outlet are configured such that the gas from the gas inlet passes through the effective surface of the reticle chuck and is evacuated via the gas outlet.

8. The reticle holding tool as claimed in claim 1, wherein a distance between the top housing member and the predetermined plane is greater than a distance between the top housing member and the effective surface of the reticle chuck.

9. The reticle holding tool as claimed in claim 1, wherein the extending direction of the lateral housing member is perpendicular to the top housing member.

10. A lithographic system, comprising:
a vacuum vessel having a first vacuum pressure;
a housing positioned in the vacuum vessel and having a second vacuum pressure that is higher than the first vacuum pressure, wherein the housing has an opening;
a reticle chuck positioned in the housing and having an effective surface for holding a reticle, wherein the effective surface is exposed through the opening;
an exposure tool configured to generate high-brightness light toward the reticle for reflection; and
a wafer stage configured to support a semiconductor wafer so as to allow the semiconductor wafer to receive the high-brightness light reflected from the reticle;
wherein the housing comprises:
a top housing member;
a lateral housing member extending from the top housing member and terminating at a lower edge which is located on a predetermined plane, wherein the effective surface of the reticle chuck is located between the predetermined plane and the top housing member; and
a lower housing member connected to the lower edge, wherein the opening is formed on the lower housing member, and a projection of the lower housing member in a direction that is perpendicular to the effective surface is located outside of the effective surface.

11. The lithographic system as claimed in claim 10, wherein a recess is formed on the lower housing member and extending from an outer edge to an inner edge of the lower housing member.

12. The lithographic system as claimed in claim 10, further comprising a gas inlet positioned in the housing, wherein the gas inlet is configured so that a gas from the gas inlet exits the housing through the opening.

13. The lithographic system as claimed in claim 10, further comprising a gas inlet positioned in the housing, wherein the gas inlet is configured to introduce a gas along a direction that is substantially parallel to the effective surface of the reticle chuck.

14. The lithographic system as claimed in claim 13, further comprising a gas outlet, and the gas inlet and the gas outlet are configured so that the gas from the gas inlet passes through the effective surface of the reticle chuck and is evacuated via the gas outlet.

15. The lithographic system as claimed in claim 10, further comprising a pump connected to the vacuum vessel and configured to create a vacuum pressure in the vacuum vessel.

16. The lithographic system as claimed in claim 10, wherein the high-brightness light generated by the high-brightness light source comprises an Extreme Ultraviolet (EUV) light.

17. A method for performing a lithography exposing process, comprising:
generating a first vacuum pressure in a vacuum vessel;
placing a reticle into a housing located in the vacuum vessel, wherein the reticle is exposed through an opening of the housing, wherein the housing comprises:
a top housing member;
a lateral housing member extending from the top housing member and terminating at a lower edge which is located on a predetermined plane, wherein a reticle chuck positioned in the vacuum vessel has an effective surface configured to secure the reticle, and the effective surface is located between the predetermined plane and the top housing member; and
a lower housing member connected to the lower edge, wherein the opening is formed on the lower housing member, and a projection of the lower housing member in a direction that is perpendicular to the effective surface is located outside of the effective surface;
applying a first flow of gas into the housing to create a second vacuum pressure which is higher than the first vacuum pressure in the housing; and
directing a high-brightness light to a semiconductor wafer via the reticle.

18. The method as claimed in claim 17, wherein the first flow of gas is directed to exit the housing via the opening.

19. The method as claimed in claim 17, further comprising applying a second flow of gas into the housing along a direction that is parallel to a predetermined plane on which the opening is located.

20. The method as claimed in claim 19, further comprising evacuating at least a portion of the second flow of gas from the housing after the second gas flow has passed through the reticle.

* * * * *